(12) United States Patent
Summerfelt et al.

(10) Patent No.: US 6,362,068 B1
(45) Date of Patent: Mar. 26, 2002

(54) ELECTRODE INTERFACE FOR HIGH-DIELECTRIC-CONSTANT MATERIALS

(75) Inventors: Scott R. Summerfelt, Dallas; Howard Roy Beratan, Richardson, both of TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/024,799

(22) Filed: Feb. 17, 1998

Related U.S. Application Data

(62) Division of application No. 08/485,856, filed on Jun. 7, 1995, now Pat. No. 5,781,404, which is a division of application No. 08/041,025, filed on Mar. 31, 1993, now Pat. No. 5,471,364.

(51) Int. Cl.[7] .................. H01L 21/20; H01L 21/8242
(52) U.S. Cl. .................. 438/396; 438/3; 438/244; 438/387; 438/253
(58) Field of Search .................. 438/3, 295, 244, 438/296, 253, 297, 387, 396

(56) References Cited

U.S. PATENT DOCUMENTS

| | | | | |
|---|---|---|---|---|
| 4,437,139 A | * | 3/1984 | Howard | 361/313 |
| 4,814,289 A | * | 3/1989 | Bauerle | 361/313 |
| 5,122,477 A | * | 6/1992 | Wolters et al. | 437/60 |
| 5,206,788 A | * | 4/1993 | Larson et al. | 361/313 |
| 5,216,572 A | * | 6/1993 | Larson et al. | 361/313 |
| 5,290,609 A | * | 3/1994 | Horiike et al. | 427/576 |

FOREIGN PATENT DOCUMENTS

| | | | | |
|---|---|---|---|---|
| JP | 4-218207 | * | 8/1992 | 361/313 |

* cited by examiner

*Primary Examiner*—Olik Chaudhuri
*Assistant Examiner*—Shrinivas H. Rao
(74) *Attorney, Agent, or Firm*—Carlton H. Hoel; W. James Brady; Frederick J. Telecky, Jr.

(57) ABSTRACT

A capacitor dielectric with multiple layers of differing high dielectric constant materials such as SrTiO3 and BaSrTiO3 in which an inner layer has a higher dielectric constant but also higher leakage current than outer layers on each side of the inner layer which have lower leakage currents but also lower dielectric constants.

6 Claims, 1 Drawing Sheet

ELECTRODE INTERFACE FOR HIGH-DIELECTRIC-CONSTANT MATERIALS

This application is a divisional of application Ser. No. 08/485,856, filed Jun. 7, 1995, now U.S. Pat. No. 5,781,404 which is a divisional of application Ser. No. 08/041,025, filed Mar. 31, 1993, now U.S. Pat. No. 5,471,364.

FIELD OF THE INVENTION

This invention generally relates to improving the electrode interface for materials with high-dielectric-constants, such as in the construction of capacitors.

BACKGROUND OF THE INVENTION

Without limiting the scope of the invention, its background is described in connection with current methods of forming electrical connections to high-dielectric-constant materials, as an example.

The increasing density of integrated circuits (e.g. DRAMs) is increasing the need for materials with high-dielectric-constants to be used in electrical devices such as capacitors. The current method generally utilized to achieve higher capacitance per unit area is to increase the surface area/unit area by increasing the topography, such as in trench and stack capacitors using $SiO_2$ or $SiO_2/Si_3N_4$ as the dielectric. This approach becomes very difficult in terms of manufacturability for devices such as the 256 Mbit and 1 Gbit DRAMs.

An alternative approach is to use a high permittivity dielectric material. Many perovskite, ferroelectric, or high-dielectric-constant (hereafter abbreviated HDC) oxides such as $(Ba,Sr)TiO_3$ (BST) usually have much larger capacitance densities than standard $SiO_2$—$Si_3N_4$—$SiO_2$ capacitors. Many different materials, such as $RuO_2$ and Pt, have been proposed for the electrodes for HDC materials. To be useful in electronic devices, the electrode/HDC material interface should generally form a connection with good overall electrical characteristics.

SUMMARY OF THE INVENTION

As used herein the term moderate-dielectric-constant (hereafter abbreviated MDC) means having a dielectric constant greater than about 150. HDC materials (i.e. having a dielectric constant of greater than about 300) are useful for the fabrication of many electrical devices, such as capacitors. Many thin-film (generally less than 5 um) applications require a small leakage-current-density in addition to a large capacitance per unit area, so it is important to find methods which reduce the leakage current but do not substantially degrade the capacitance. The leakage current is sensitive to many variables such as thickness, microstructure, electrodes, electrode geometry and composition. In particular, it appears that the leakage current is controlled by Schottky barriers. For example, the leakage current of lead zirconium titanate (PZT) using $RuO_2$ electrodes is several orders of magnitude larger than the leakage current of PZT using Pt electrodes. The smaller leakage current with Pt electrodes appears to be due to the larger work function.

One method of controlling the leakage current is to control the materials at the electrode/ dielectric interface. MDC materials (e.g. $SrTiO_3$ (ST)) generally have lower leakage-current-density (and lower permittivity) than HDC materials (e.g. BST) with the same thickness and electrodes. Surrounding the relatively higher permittivity HDC material with a thin layer of an MDC material generally results in a structure with lower leakage current yet relatively little dielectric constant degradation. Thin layers of the MDC material at the electrode interface(s) would have essentially the same effect.

The disclosed structures generally provide the high permittivity of HDC materials, with relatively smaller leakage currents when compared to structures in which the dielectric is all HDC material. One embodiment of this invention comprises a first thin dielectric buffer layer of a first leakage-current-density material with a first moderate-dielectric-constant, a high-dielectric-constant layer of a second leakage-current-density material overlaying the first thin dielectric buffer layer, and a second thin dielectric buffer layer of a third leakage-current-density material with a second moderate-dielectric-constant overlaying the high-dielectric-constant layer, wherein the first and third leakage-current-density materials have substantially lower leakage-current-densities than the second leakage-current-density material. The first and second thin dielectric buffer layers substantially limit the leakage-current-density of the structure, with only modest degradation of the dielectric constant of the structure. A method of forming an embodiment of this invention comprises the steps of forming a first thin dielectric buffer layer of a first leakage-current-density material with a first moderate-dielectric-constant, forming a high-dielectric-constant layer of a second leakage-current-density material on the first thin dielectric buffer layer, and forming a second thin dielectric buffer layer of a third leakage-current-density material with a second moderate-dielectric-constant on the high-dielectric-constant layer, wherein the first and third leakage-current-density materials have substantially lower leakage-current-densities than the second leakage-current-density material.

These are apparently the first thin-film structures wherein a thin dielectric barrier layer of a low leakage-current-density MDC material is used to reduce the leakage current of a thin-film ferroelectric or high-dielectric-constant oxide structure. It is generally desirable to minimize the ratio of the thickness of the low leakage-current-density MDC material to the thickness of the HDC material in order to keep the dielectric constant of the structure within 50% (preferably within 90% and more preferably within 95%) of the dielectric constant of the HDC material when used alone. As used herein, the term "thin", when used in conjunction with the dielectric barrier layer, means less than $\frac{1}{10}$ (preferably less than $\frac{1}{20}$ and more preferably less than $\frac{1}{50}$) the thickness of the high-dielectric-constant material. As used herein, the terms "low" and "lower", when used in reference to leakage-current-density of the dielectric buffer layer, mean substantially smaller (and preferably less than $\frac{1}{5}$ and more preferably less than $\frac{1}{10}$) than the leakage-current-density of a layer of HDC material with the same thickness, electrodes, etc. The possibly lower dielectric constant of the structure is generally compensated for by the reduced leakage current of the structure. The additional layers generally require only minor modifications of existing processes, since the same processes that are used for the high-dielectric-constant oxide can generally be used for the moderate-dielectric-constant material. These structures may also be used for multilayer capacitors and other thin-film ferroelectric devices such as pyroelectric materials, non-volatile memories, thin-film piezoelectric and thin-film electro-optic oxides.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
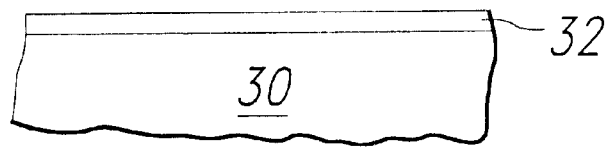
FIGS. 1–3 are cross-sectional views of a method for constructing a relatively low leakage current interface for a high-dielectric-constant material.
Figure 2:
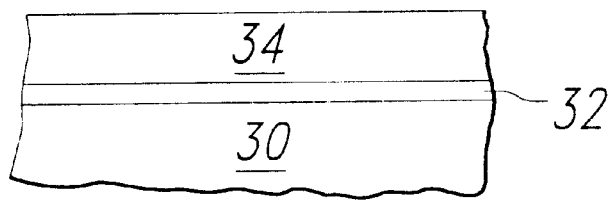
Figure 3:
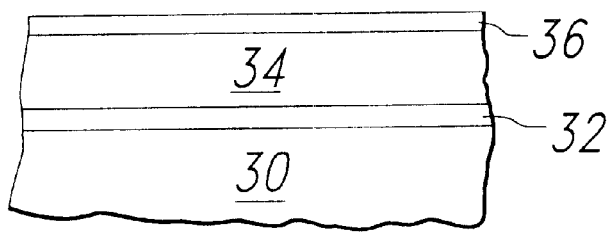

With reference to FIGS. 1–3, there is shown a method of forming a preferred embodiment of this invention, a high-dielectric-constant material sandwiched between two low leakage-current-density MDC materials. FIG. 1 illustrates a thin strontium titanate layer 32 deposited on the surface of a platinum electrode 30. FIG. 2 illustrates a barium strontium titanate layer 34 deposited on the strontium titanate layer 32. FIG. 3 illustrates a second thin layer of strontium titanate 36 deposited on the barium strontium titanate layer 34. ST thin-films generally have lower leakage currents than BST films of the same thickness and electrodes, so sandwiching the BST layer 34 between the thin ST layers 32 and 34 should result in a structure with lower leakage current yet relatively little dielectric constant degradation. As an example, the leakage current of a ST film 53 nm thick at 2V is $10^{-8}$ A/cm$^2$, while the leakage current of a BST film 70 nm at 2V is $10^{-7}$ A/cm$^2$. Table 1, below, illustrates various examples of the effective dielectric constant of the structure for different thicknesses of the ST 32 and 36, and for different values of the dielectric constant of the BST 34. The percent degradation in dielectric constant of the structure to that of a structure in which the dielectric is all HDC material is also shown. Table 1 assumes a total thickness of 100 nm, thicknesses of 2, 5, and 10 nm each for the ST layers 32 and 36, a dielectric constant of 230 for the ST 32 and 36, and dielectric constants of 300, 500 and 700 for the BST 36. Standard equations for capacitance were used to derive the values in Table 1.

TABLE 1

| ST Layer Thickness | ($K_{BST}$ = 300) $K_{effective}$, (% degradation) | ($K_{BST}$ = 500) $K_{effective}$, (% degradation) | ($K_{BST}$ = 700) $K_{effective}$, (% degradation) |
| --- | --- | --- | --- |
| 2 nm | 296 (1.3%) | 478 (4.4%) | 647 (7.6%) |
| 5 nm | 291 (3.0%) | 447 (10.6%) | 581 (17%) |
| 10 nm | 283 (5.7%) | 405 (19%) | 497 (29%) |

As expected, there is significant degradation in effective dielectric constant for thicker layers of ST 32 and 36, and for larger BST 34 dielectric constants. The highest known achieved dielectric constant for BST films 100 nm thick is currently about 460. Due to thin-film effects, the dielectric constant of a material in a thin-film is generally substantially less (typically more than an order of magnitude less) than the dielectric constant of the material in bulk. Future research will probably produce even higher dielectric constants for BST films, and PZT films are generally known to have even higher dielectric constants. Table 1, above, shows that a 2 nm thick ST layer at each interface with a BST layer with a dielectric constant of 700 results in only about a 7.6% degradation in the effective dielectric constant or equivalently the capacitance per unit area. The dielectric constant is only modestly lower but the leakage current is substantially lower.

The additional ST layers 32 and 36 require very little additional processing. The deposition of the ST layers 32 and 36, and the BST layer 34 may be performed using substantially the same processes. In the case of CVD, the deposition of the ST 32 and 36 is easier than the BST 34 and does not require any more metalorganic sources. In the case of sputtered deposition, the ST 32 and 36, and BST 34 deposition may be performed in the same chamber with one additional sputtered target. Since the ST 32 and 36, and BST 34 are substantially similar chemically, it is generally possible to etch the ST 32 and 36 using the essentially the same process as to etch the BST 34.

Figure 4:
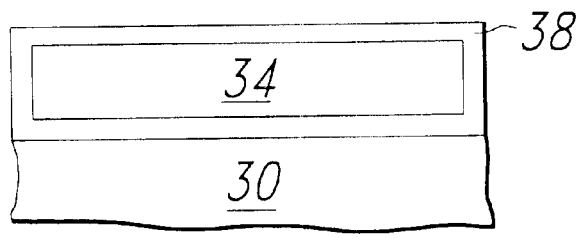
FIG. 4 is a cross-sectional view of an HDC material surrounded by an MDC material.

In an alternate embodiment, FIG. 4 shows a layer of BST 34 surrounded by a thin-film of strontium titanate 38. This serves to illustrate that the ST 38 may formed in such a way that it surrounds the BST 34, as opposed to just being formed at the electrode interfaces as in FIGS. 1–3.

Figure 5:
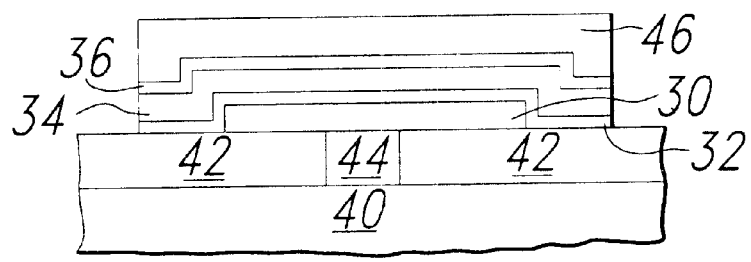
FIG. 5 is a cross-sectional view of a relatively low leakage current HDC capacitor formed on the surface of a semiconductor substrate.

In another alternate embodiment, FIG. 5 illustrates a microelectronic capacitor formed on a silicon substrate 40. The Pt lower electrode 30, the thin ST layers 32 and 36, and the BST layer 34 are essentially the same as described in FIG. 3. A TiN upper electrode 46 is shown overlaying the upper ST layer 36, and a TiN conductive plug 44 is shown making an electrical connection to the Pt lower electrode 30 through the SiO$_2$ insulating layer 42.

Table 2, below, provides an overview of some embodiments and the drawings.

TABLE 2

| Drawing Element | Generic Term | Preferred or Specific Examples | Other Alternate Examples |
| --- | --- | --- | --- |
| 30 | Lower electrode | Platinum | Other noble metals (e.g. palladium, rhodium, gold, iridium, silver) Conductive metal compounds (e.g. oxides: ruthenium dioxide, tin oxide, titanium monoxide; nitrides: ruthenium nitride, tin nitride, titanium nitride, zirconium nitride) |
| 32 | Lower dielectric buffer layer | Strontium titanate | Other relatively low leakage-current-density perovskite, ferroelectric, or high-dielectric-constant oxides (e.g. (Sr,Ca,Mg)(Ti,Zr,Hf)O$_3$) |
| 36 | Upper dielectric buffer layer | | |
| 38 | Surrounding dielectric buffer layer | | Relatively low leakage-current-density acceptor (e.g. Na, Al, Mn, Ca, K, Cr, Mn, Co, Ni, Cu, Zn, Li, Mg) and/or donor (e.g. F, Cl, V, Nb, Mo, La, Ce, Pr, Nd, Sm, Eu, Gd, Tb, Dy, Ho, Er, Ta, W) doped perovskite, ferroelectric, or high-dielectric-constant oxides (e.g. (Sr,Ca,Mg)(Ti,Zr,Hf)O$_3$) |

TABLE 2-continued

| Drawing Element | Generic Term | Preferred or Specific Examples | Other Alternate Examples |
|---|---|---|---|
| 34 | High-dielectric-constant material | Barium strontium titanate | Other perovskite, ferroelectric or high-dielectric-constant oxides (e.g. (Ba,Sr,Pb,La)(Ti,Zr)$O_3$, bismuth titanate, potassium tantalate, lead niobate, lead zinc niobate, potassium niobate, lead magnesium niobate) Acceptor (e.g. Na, Al, Mn, Ca, K, Cr, Mn, Co, Ni, Cu, Zn, Li, Mg) and/or donor (e.g. F, Cl, V, Nb, Mo, La, Ce, Pr, Nd, Sm, Eu, Gd, Tb, Dy, Ho, Er, Ta, W) doped perovskite, ferroelectric, or high-dielectric-constant oxides (e.g. (Ba,Sr,Pb,La)(Ti,Zr)$O_3$, bismuth titanate, potassium tantalate, lead niobate, lead zinc niobate, potassium niobate, lead magnesium niobate) |
| 40 | Semiconductor substrate | Silicon | Other single component semiconductors (e.g. germanium, diamond) Compound semiconductors (e.g. GaAs, InP, Si/Ge, SiC) |
| 42 | Insulator | Silicon dioxide | Other insulators (e.g. silicon nitride) |
| 44 | Conductive plug | Titanium nitride | Reactive metals (e.g. tantalum, tungsten, titanium, molybdenum) Other reactive metal compounds (e.g. nitrides: zirconium nitride; silicides: titanium silicide, tantalum silicide, tungsten silicide, molybdenum silicide, nickel silicide; carbides: tantalum carbide; borides: titanium boride) Conductive carbides and borides (e.g. boron carbide) Single component semiconductors (e.g. single crystalline and polycrystalline silicon, germanium, diamond) Compound semiconductors (e.g. GaAs, InP, Si/Ge, SiC) |
| 46 | Upper electrode | Titanium nitride | Other conductive metal compounds (e.g. nitrides: ruthenium nitride, tin nitride, zirconium nitride; oxides: ruthenium dioxide, tin oxide, titanium monoxide) Noble metals (e.g. platinum, palladium, rhodium, gold, iridium, silver) Other common semiconductor electrodes (e.g. silicides, Al, Cu) |

A few preferred embodiments have been described in detail hereinabove. It is to be understood that the scope of the invention also comprehends embodiments different from those described, yet within the scope of the claims. With reference to the structures described, electrical connections to such structures can be ohmic, rectifying, capacitive, direct or indirect, via intervening circuits or otherwise. Implementation is contemplated in discrete components or fully integrated circuits in silicon, germanium, gallium arsenide, or other electronic materials families. In general the preferred or specific examples are preferred over the other alternate examples.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a microelectronic capacitor, said method comprising:

(a) forming a first electrically conductive electrode;

(b) forming a first thin strontium titanate layer over said first electrically conductive electrode;

(c) forming a barium strontium titanate layer over said first thin strontium titanate layer, and (d) forming a second electrically conductive electrode over said barium strontium titanate layer.

2. The method of claim 1, further comprising the step of forming a second thin strontium titanate layer over said barium strontium titanate layer prior to said step of forming said second electrically conductive electrode.

3. A method of forming a capacitor, comprising the steps of:

(a) forming a first electrode;

(b) forming a first dielectric layer of a first thickness over said first electrode, said first dielectric layer of a first material characterized by a dielectric constant of greater than 150;

(c) forming a second dielectric layer of a second thickness over said first dielectric layer, said second dielectric layer of a second material differing from said first material and characterized by a dielectric constant of greater than 300, wherein said first thickness is less than one-tenth said second thickness; thickness;

(d) forming a second electrode over said second dielectric layer.

4. The method of claim 3, further comprising the step of forming a third dielectric layer of a third thickness between said second dielectric layer and said second electrode, said third dielectric layer characterized by a dielectric constant of greater than 150, wherein said third thickness is less than one-tenth said second thickness.

5. A method of forming a dynamic random access memory capacitor, comprising the steps of:

(a) forming an insulating layer over a semiconductor substrate;

(b) forming a conductive plug in said insulating layer, said conductive plug in electrical connection with said substrate;

(c) forming a first electrode over said conductive plug, said first electrode in electrical connection with said conductive plug;

(d) forming a strontium titanate layer over said first electrode;
(e) forming a barium strontium titanate layer over said strontium titanate layer; and
(f) forming a second electrode over said barium strontium titanate layer.

6. The method of claim 5, further comprising the step of:
forming a strontium titanate layer over said barium strontium titanate layer prior to said step of forming said second electrode.

* * * * *